(12) United States Patent
Mishra et al.

(10) Patent No.: US 11,923,852 B2
(45) Date of Patent: Mar. 5, 2024

(54) HIGH TO LOW LEVEL SHIFTER ARCHITECTURE USING LOWER VOLTAGE DEVICES

(71) Applicant: Advanced Micro Devices, Inc., Santa Clara, CA (US)

(72) Inventors: Prateek Mishra, Kanpur (IN); Thanapandi G, Sivangangai (IN); Jagadeesh Anathahalli Singrigowda, Bangalore (IN); Dhruvin Devangbhai Shah, Bangalore (IN); Girish Anathahalli Singrigowda, Bangalore (IN); Animesh Jain, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/487,467

(22) Filed: Sep. 28, 2021

(65) Prior Publication Data

US 2023/0098336 A1 Mar. 30, 2023

(51) Int. Cl.
*H03K 3/037* (2006.01)
*H03K 17/081* (2006.01)
*H03K 19/00* (2006.01)

(52) U.S. Cl.
CPC ....... *H03K 3/037* (2013.01); *H03K 17/08104* (2013.01); *H03K 19/0002* (2013.01)

(58) Field of Classification Search
CPC ............... H03K 5/003; H03K 19/0175; H03K 19/0002; H03K 17/08; H03K 17/081
See application file for complete search history.

(56) References Cited

U.S. PATENT DOCUMENTS

| | | | | |
|---|---|---|---|---|
| 7,009,424 | B2 * | 3/2006 | Khan | H03K 3/356113 |
| | | | | 326/68 |
| 9,209,810 | B2 * | 12/2015 | Williams | H03K 19/018521 |
| 2017/0222650 | A1 * | 8/2017 | Cui | H03K 19/018521 |
| 2020/0287545 | A1 * | 9/2020 | Nagasawa | H03K 17/6872 |

* cited by examiner

*Primary Examiner* — Patrick C Chen
(74) *Attorney, Agent, or Firm* — Polansky & Associates, P.L.L.C.; Paul J. Polansky; Nathan H. Calvert

(57) ABSTRACT

A voltage level-shifting circuit for an integrated circuit includes an input terminal receiving a voltage signal referenced to an input/output (I/O) voltage level. A transistor overvoltage protection circuit includes a first p-type metal oxide semiconductor (PMOS) transistor includes a source coupled to the second voltage supply, a gate receiving an enable signal, and a drain connected to a central node. A first n-type metal oxide semiconductor (NMOS) transistor includes a drain connected to the central node, a gate connected to the input terminal, and a source connected to an output terminal. A second NMOS transistor includes a drain connected to the input terminal, a gate connected to the central node, and a source connected to the output terminal.

20 Claims, 4 Drawing Sheets

HIGH TO LOW LEVEL SHIFTER ARCHITECTURE USING LOWER VOLTAGE DEVICES

BACKGROUND

A System-on-Chip (SoC) requires interaction between peripheral devices and internal core circuits. This interaction is accomplished by Input/Output (I/O) circuits, which communicate between the internal core circuits in SoCs and peripheral devices. I/O circuits usually include a driver to transmit digital signals to peripheral devices and a receiver to receive digital signals from peripheral devices. Such peripheral devices require signaling at voltage levels which are significantly higher than the on-chip core voltage circuits, and require Level Shifter Circuits for converting the voltage signal level from the I/O voltage domain to the Core voltage domain and vise-versa.

As transistors on semiconductor devices get smaller with new generations of technology nodes, for example the reduction to the latest fin field-effect transistor (FinFET) nodes built with 5 nm node technology, foundries often stop supporting high voltage transistor devices capable of operating in the range of 1.8V. This lack of support makes implementation of legacy level shifter designs challenging, and requires design improvements to implement level shifters. Conventional I/O circuit designs operate in I/O voltage domain having relatively high supply voltages, such as 1.8V, while core voltage domains having lower supply voltages such as 0.75V. With many recent FinFET technology nodes, there are electrical overstress issues in creating level shifters between the core voltage domain and the 1.8V I/O voltage domain, due to the availability of only 1.5V devices. Such device overstress problems are new to current generation implementations because prior implementations of the level shifter circuits included higher voltage devices.

Figure 1:
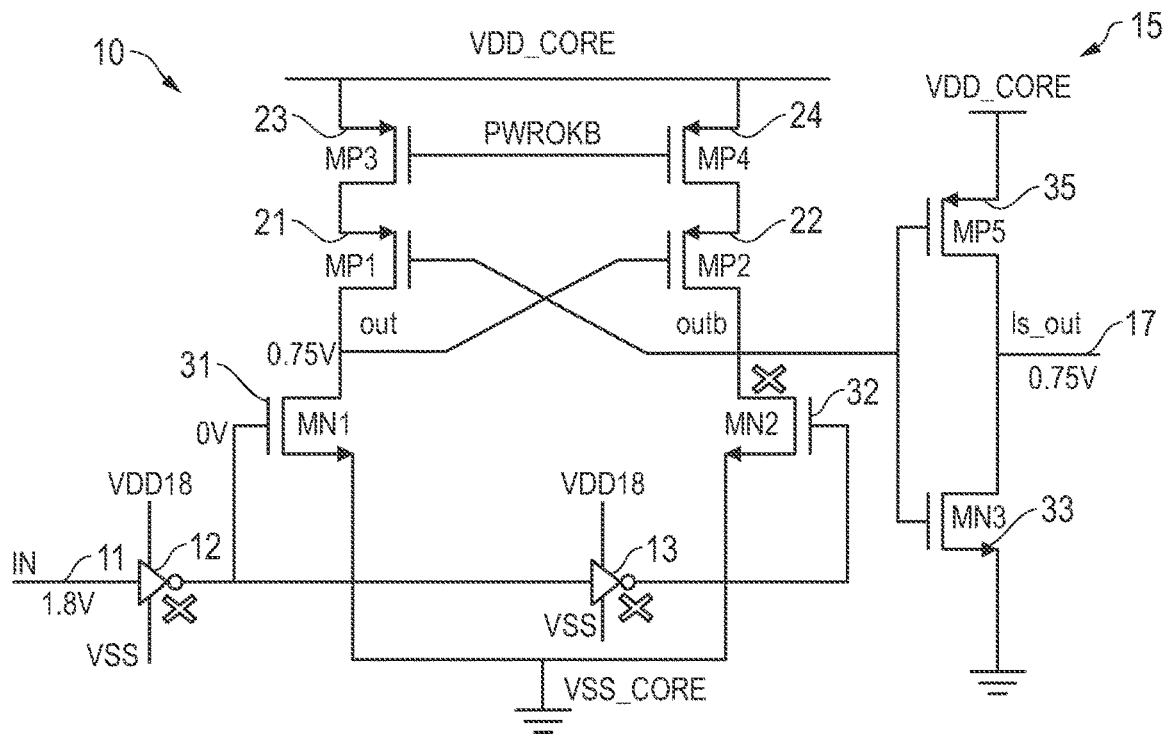
FIG. 1 illustrates in circuit diagram form a level shifter according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a voltage level-shifting circuit for an integrated circuit (IC) includes an input terminal receiving a voltage signal referenced to an input/output voltage level supplied by an input/output voltage supply, and a transistor overvoltage protection circuit. The transistor overvoltage protection circuit is supplied with a second voltage supply with a voltage level lower than the input/output voltage level and includes a first p-type metal oxide semiconductor (PMOS) transistor, and first and second n-type metal oxide semiconductor (NMOS) transistors. The first PMOS transistor has a source coupled to the second voltage supply, a gate receiving an enable signal, and a drain connected to a central node. The first NMOS transistor has a drain connected to the central node, a gate connected to the input terminal, and a source connected to an output terminal. The second NMOS transistor has a drain connected to the input terminal, a gate connected to the central node, and a source connected to the output terminal. An inverter is supplied with the second supply voltage and has an input terminal connected to the output terminal of the transistor overvoltage protection circuit.

In another form, an integrated circuit (IC) includes a transistor overvoltage protection circuit and plurality receivers connected to respective external terminals of the IC and receiving signals referenced to an input/output voltage level supplied by an input/output voltage supply. The transistor overvoltage protection circuit is supplied with a second voltage supply with a voltage level lower than the input/output voltage level and includes a first PMOS transistor, and first and second NMOS transistors. The first PMOS transistor has a source coupled to the second voltage supply, a gate receiving an enable signal, and a drain connected to a central node. The first NMOS transistor has a drain connected to the central node, a gate connected to the input terminal, and a source connected to an output terminal. The second NMOS transistor has a drain connected to the input terminal, a gate connected to the central node, and a source connected to the output terminal. An inverter is supplied with the second supply voltage and has an input terminal connected to the output terminal of the transistor overvoltage protection circuit.

In still another form, a method is provided for operating an integrated circuit (IC). The method includes receiving a data signal at a receiver circuit operating with a first supply voltage. An enable signal is driven onto the gate of a first PMOS transistor with a source coupled to a second voltage supply with a voltage level lower than that of the first supply voltage, and a drain connected to a central node. The received data signal is driven on a gate of a first NMOS transistor including a drain connected to the central node and a source connected to an output terminal. The received data signal is also applied to a drain of a second NMOS transistor including a gate connected to the central node, and a source connected to the output terminal.

FIG. 1 illustrates in circuit diagram form a level shifter 10 according to the prior art. Level shifter 10 generally includes an input terminal 11, an inverter 12, an inverter 13, an output inverter 15, an output terminal 17 labeled "ls_out", and a group of complementary metal-oxide-semiconductor (CMOS) transistors generally indicated by the label 10. To illustrate the effects of overvoltage, level shifter 10 is labeled with certain voltage levels present when a 1.8V digital input signal is applied at input terminal 11 and level shifted to produce a 0.75V digital signal at output terminal 17.

Level shifter 10 is supplied with a core voltage supply labeled "VDD_CORE", and generally receives an input signal "IN" from an I/O voltage domain supplied with a 1.8V I/O voltage supply labeled VDD18. A first pair of p-type metal-oxide-semiconductor (PMOS) transistors 21 and 23 is connected in series between the VDD_CORE voltage rail and the drain of an n-type metal-oxide-semiconductor (NMOS) transistor 31. A second pair of PMOS transistors 22 and 24 is connected in series between the VDD_CORE voltage rail and NMOS transistor 32. The gate of PMOS transistor 21 is connected to the drain of PMOS transistor 22. The gate of PMOS transistor 22 is connected to the drain of PMOS transistor 21.

Input terminal 11 feeds the incoming 1.8V level signal to inverter 12, which is supplied from the I/O voltage supply VDD18. The output of inverter 12 is connected to the gate of NMOS transistor 31 and to the input of inverter 13. The output of inverter 13 is connected to the gate of NMOS transistor 32.

The level-shifted signal produced at the node labeled "outb" is connected to the input of output inverter 15. Output inverter 15 includes a PMOS transistor 35 connected between the VDD_CORE voltage rail and output terminal 17, and NMOS transistor 33 connected between the negative core supply terminal VSS_CORE and output terminal 17.

The depicted transistors are also labeled with schematic part names such as "MP1", and "MN1" to refer to Table 1 and Table 2. To use the conventional level shifter design with a process node without 1.8V devices, the design employs 1.5V rated devices for NMOS transistor 31 (MN1) and NMOS transistor 32 (MN2), as well as for all transistors implementing inverter 12 and inverter 13. This 1.5V rating refers to the tolerance voltages of the device, particularly the rated gate-to-source ($V_{gs}$), gate-to-drain ($V_{gd}$) and drain-to-source ($V_{ds}$) tolerance voltages, which are generally the same for a particular device. Table 1 lists the absolute value of the $V_{gs}$, $V_{gd}$, and $V_{ds}$ voltages on various devices of FIG. 1 when input signal IN is high. In this state, the output of inverter 12 is 0V and the output of the inverter 13 is 1.8V. Thus, as shown in Table 1 below, the gate-to-source voltage $V_{gs}$ for NMOS transistor 32 (MN2) is 1.8V, causing overstress across NMOS transistor 32 (MN2) as depicted by the "X" at NMOS transistor 32, because the $V_{gs}$ of 1.8V is higher than the rated $V_{gs}$ voltage of the transistor.

TABLE 1

Device Terminal Voltages When Input Signal is High

| Device Name | $|V_{gs}|$ | $|V_{ds}|$ | $|Vgd|$ | Device Stress |
|---|---|---|---|---|
| MN1 | 0 | 0.75 V | 0.75 V | Normal |
| MN2 | 1.8 V | 0 | 1.8 V | Over-stress |
| MP1 | 0.75 V | 0 | 0.75 V | Normal |
| MP2 | 0 | 0.75 V | 0.75 V | Normal |
| MN3 | 0 | 0.75 V | 0.75 V | Normal |
| MP5 | 0.75 V | 0 | 0.75 V | Normal |

Figure 2:
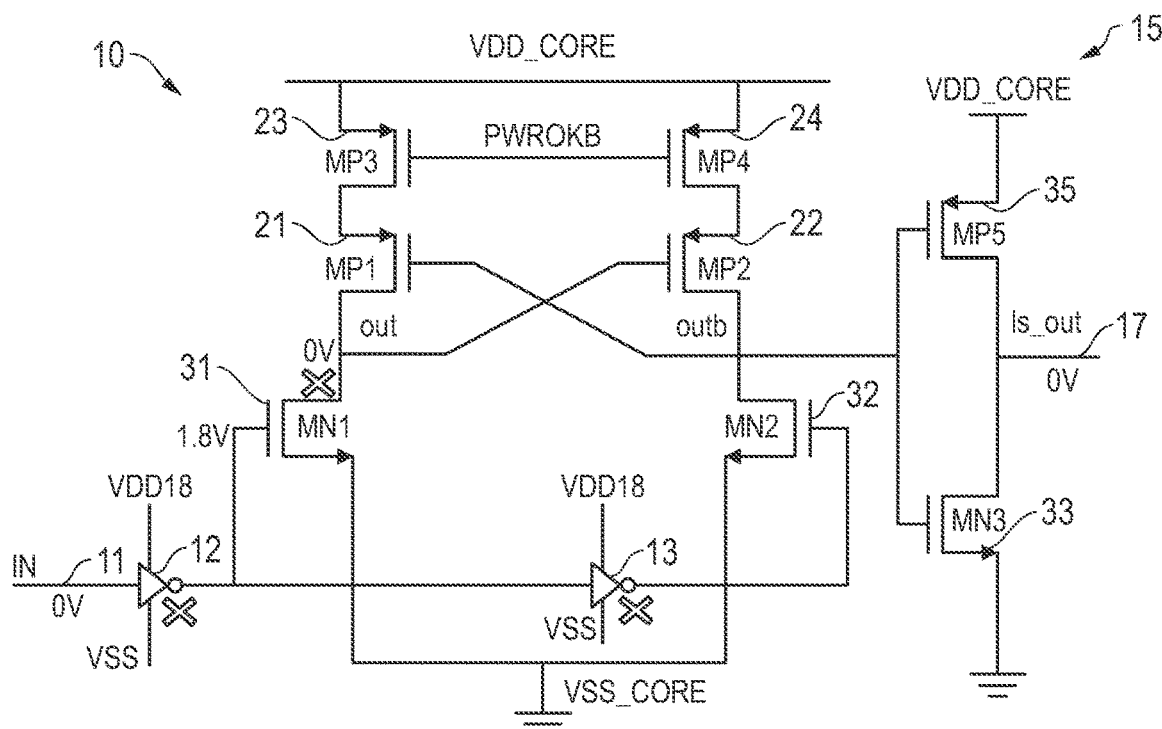
FIG. 2 illustrates in circuit diagram form the level shifter of FIG. 1 under different voltage conditions.

A similar over-stress problem is created at NMOS transistor 31 (MN1) when the input signal IN is low. FIG. 2 illustrates in circuit diagram form the level shifter 10 of FIG. 1 with the input signal IN low or 0V as shown. In this condition, inverters 12 and 13 experience voltage overstress conditions, as indicated by the "X" next to inverters 12 and 13. Also, because the output of inverter 12 is high at 1.8V in this condition, the NMOS transistor 31 experiences electrical overstress conditions by having a gate to drain voltage $V_{gd}$ of 1.8V and a gate to source voltage $V_{gs}$ of 1.8V, as indicated by the "X" next to NMOS transistor 31. The transistor terminal voltages in the depicted condition are shown in Table 2 below, which lists the $V_{gs}$, $V_{gd}$, and $V_{ds}$ voltages on various transistors of FIG. 2 when input signal IN is low (0V).

TABLE 2

Device Terminal Voltages When Input Signal is Low

| Device Name | $|V_{gs}|$ | $|V_{ds}|$ | $|Vgd|$ | Device Stress |
|---|---|---|---|---|
| MN1 | 1.8 V | 0 | 1.8 V | Over-stress |
| MN2 | 0 | 0.75 V | 0.75 V | Normal |
| MP1 | 0 | 0.75 V | 0.75 V | Normal |
| MP2 | 0.75 V | 0 | 0.75 V | Normal |
| MN3 | 0.75 V | 0 | 0.75 V | Normal |
| MP5 | 0 | 0.75 V | 0.75 V | Normal |

Referring the prior art level shifter of FIG. 1 and FIG. 2, inverter 12 and inverter 13 are operating in VDD18 domain and include CMOS devices that are also exposed to overstress if a conventional inverter design of pull-up and pull-down CMOS transistors is used. In such a design, each inverter has device overstress due to either $V_{gs}$, $V_{gd}$ or $V_{ds}$ on each transistor of the inverter whether the input signal IN is High or Low.

Figure 3:
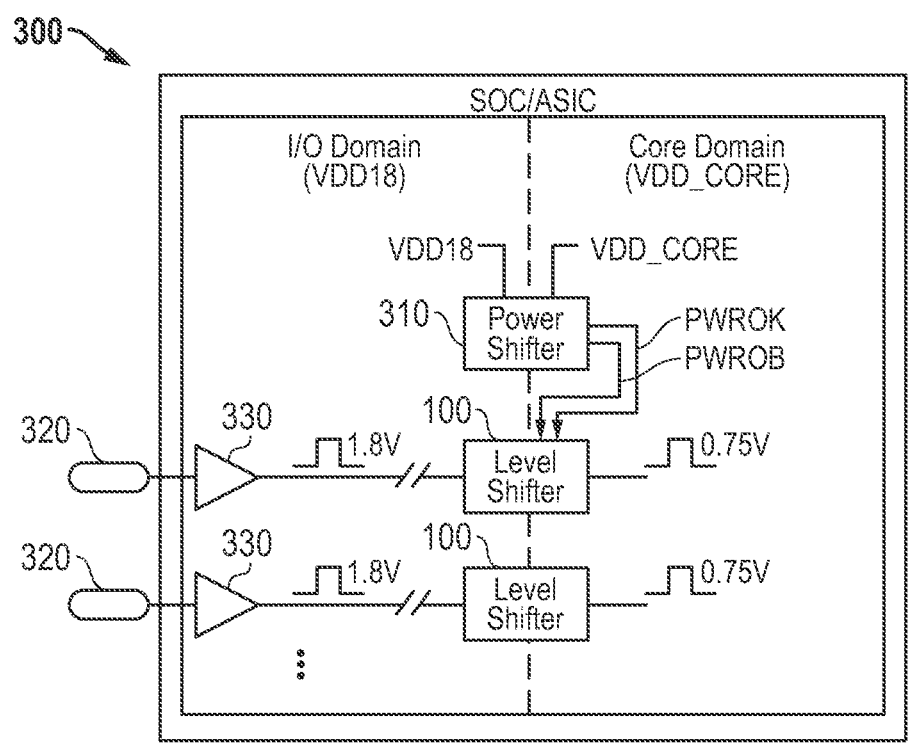
FIG. 3 depicts in block diagram form a cross-domain circuit according to some embodiments.

FIG. 3 depicts in block diagram form a cross-domain circuit 300 according to some embodiments. Cross-domain circuit 300 generally is part of a system-on-chip (SOC) or application specific IC (ASIC) and includes a power sniffer 310, a number of receivers 330, and a number of level shifter circuits 100 which operate to shift the voltage level of digital signals received at receivers 320 from an I/O voltage domain (VDD18) level to a core voltage domain (VDD_CORE).

Receivers 330 are connected to respective external terminals 320 of the IC and receiving signals referenced to the I/O voltage level of voltage supply VDD18. VDD18 is a 1.8V supply in this example. However, in other embodiments, especially technology nodes smaller than 5 nanometers, lower voltages may be used for the I/O voltage supply. External terminals 320 are conductive structures such as solder bumps, wire bond pads, or other terminal structures that carry signals between ICs.

Power sniffer 310 is a digital circuit which detects the presence of the power supply voltages VDD18 and VDD_CORE, and produces control signals for level shifter circuits 100. In this embodiment, power sniffer 310 produces a first enable signal "PWROK" which transitions to a logical high to indicate that supply voltage VDD_CORE is active, and a second enable signal PWROKB, which is the logical inverse of first control signal PWROK. These signals are referenced to the level of power supply VDD_CORE. Enable signals PWROK and PWROKB are fed to each level shifter circuit 100 to enable circuit overvoltage protection features as further described below.

In this embodiment, level shifters 100 shift the level of digital signaling from the 1.8V level of voltage supply VDD18 to a 0.75V level, the level of the core voltage supply VDD_CORE, as indicated by digital squarewave symbols shown in FIG. 3. While a 0.75V core supply voltage is used in this example, the level shifter circuits herein are suitable for use with even lower core supply voltages.

Figure 4:
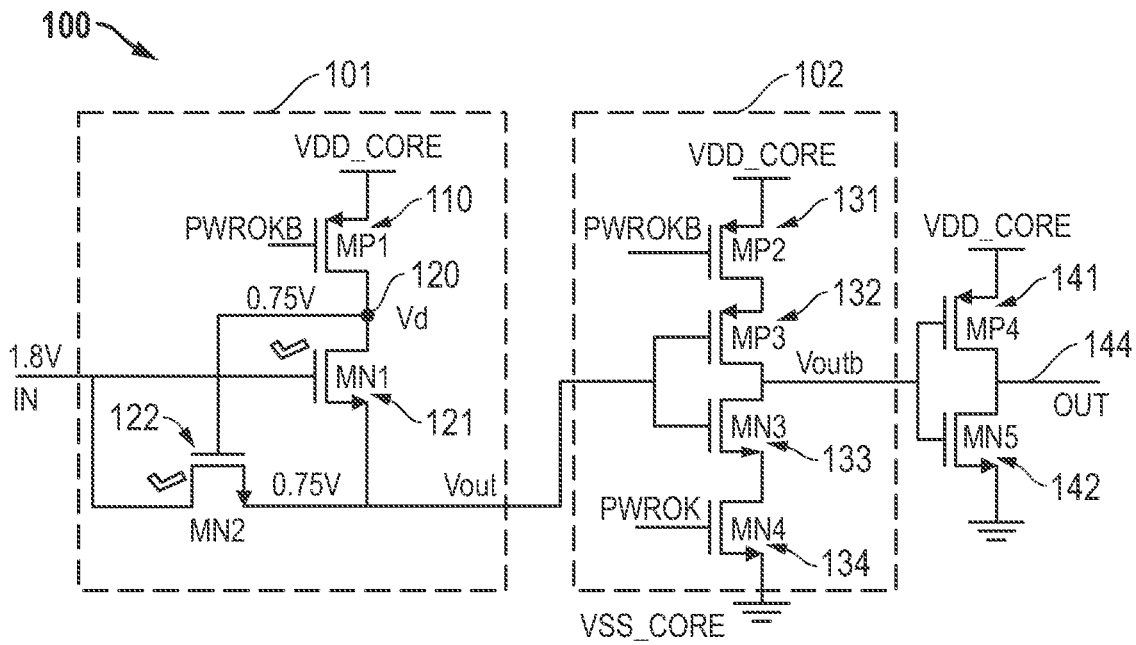
FIG. 4 illustrates in circuit diagram form a level shifter circuit according to some embodiments.
Figure 5:
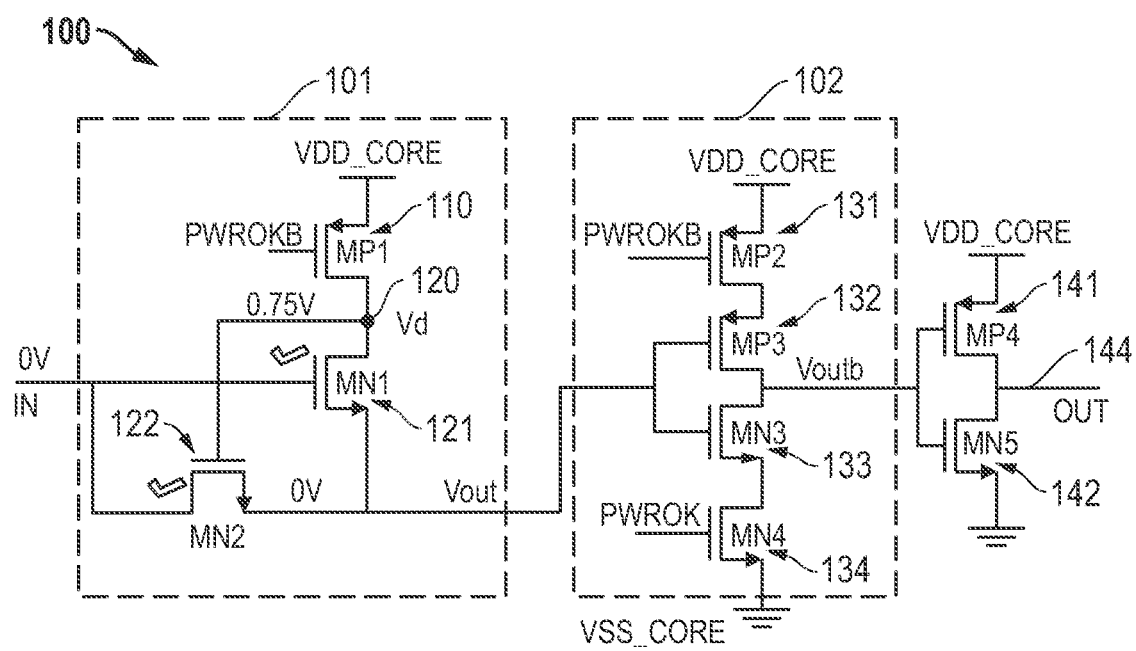
FIG. 5 illustrates in circuit diagram form the level shifter circuit of FIG. 4 under different voltage conditions.

FIG. 4 illustrates in circuit diagram form a level shifter circuit 100 according to some embodiments. FIG. 5 shows the level shifter circuit of FIG. 4 with different voltage conditions. Level shifter circuit 100 generally includes a transistor overvoltage protection circuit 101 and a tristate buffer 102.

Transistor overvoltage protection circuit 101 is supplied with a voltage supply VDD_CORE and has an input terminal labeled "IN" receiving a signal from one of the receivers referenced to the level of I/O voltage supply VDD18. Transistor overvoltage protection circuit 101 includes PMOS transistor 110, an NMOS transistor 121, and an NMOS transistor 122. PMOS transistor 110 has a source coupled to voltage supply VDD_CORE, a gate receiving an enable signal PWROKB, and a drain connected to a central node 120. NMOS transistor 121 has a drain connected to the central node, a gate connected to the input terminal IN, and a source connected to an output terminal "Vout". NMOS transistor 122 has a drain connected to input terminal IN, a gate connected to central node 120, and a source connected to output terminal Vout.

Tristate buffer 102 is a tri-state inverter including PMOS transistor 131, PMOS transistor 132, NMOS transistors 133 and NMOS transistor 134. PMOS transistor 131 has a source connected to supply voltage VDD_CORE, a gate receiving enable signal PWROKB, and a drain. PMOS transistor 132 has a source connected to the drain of PMOS transistor 131, a gate connected to output terminal Vout, and a drain connected to a buffer output terminal "Voutb". NMOS transistor 134 has a source connected to the negative core supply rail VSS_CORE, a gate receiving enable signal PWROK, and a drain. NMOS transistor 133 has a source connected to the drain of NMOS transistor 134, a gate connected to output terminal Vout, and a drain connected to the buffer output terminal Voutb.

The buffer output terminal of tristate buffer 102 is connected to the input terminal of an inverter including a PMOS transistor 141 and an NMOS transistor 142. PMOS transistor 141 has a source receiving supply voltage VDD_CORE, a gate connected to the inverter input terminal and a drain connected to an output 144. NMOS transistor 142 has a source connected to the negative core supply rail VSS_CORE, a gate connected to the inverter input terminal, and a drain connected to output 144. The level-shifted signal referenced to the level of supply voltage VDD_CORE is supplied to circuitry in the core domain of the IC from output 144.

PMOS transistor 110 and NMOS transistors 121 and 122 are 1.5V rated devices, but are employed to scale down incoming VDD18 input voltage signal referenced to 1.8V into VDD_CORE domain signal referenced to 0.75V without experiencing overvoltage conditions in which their $V_{gs}$, $V_{gd}$ or $V_{ds}$ exceed 1.5V.

In operation, when enable signal PWROK is high, enable signal PWROKB is low which causes PMOS transistor 110 to be turned ON. In this condition, the drain voltage ($V_d$) of NMOS transistor 121 is at VDD_CORE (0.75V) as shown by the label at node 120.

When the input signal IN is 0V, as depicted in FIG. 5, NMOS transistors 122 is ON causing node voltage Vout to be 0, thus protecting the NMOS transistors 121 and 122 from over-stress as depicted by the check marks next to transistors 121 and 122. During such operation, NMOS transistors 121 sees a gate-to-source voltage of 0V and drain-to-source voltage of VDD_CORE (0.75V), and NMOS transistors 122 sees a drain-to-source voltage of 0V and gate-to-source voltage of VDD_CORE (0.75V). For values of VDD18 and VDD_CORE are 1.8V and 0.75V, respectively, Table 3 lists terminal voltage across the different MOS devices (the table refers to schematic device names shown in FIG. 5. As can be seen, all the three transistors 110 (MP1), 121 (MN1), and 122 (MN2) are safeguarded from over-stress.

TABLE 3

Devices terminal voltages in level shifter input stage when input is 0

| MOS | $|V_{ds}|$ | $|V_{gs}|$ | $|V_{gd}|$ | Device Stress |
| --- | --- | --- | --- | --- |
| MP1 | 0 | 0.75 V | 0.75 V | Normal Stress |
| MN1 | 0.75 V | 0 | 0.75 V | Normal Stress |
| MN2 | 0 | 0.75 V | 0.75 V | Normal Stress |

When the input signal IN is 1.8V, as depicted in FIG. 4, NMOS transistor 121 is ON and NMOS transistor 122 is OFF, causing the node voltage Vout to be VDD_CORE. During such operation, NMOS transistor 121 has a gate-to-source voltage of VDD18-VDD_CORE (1.8V-0.75V) and drain-to-source voltage of 0V. NMOS transistor 122 has a gate-to-source voltage of 0V and drain-to-source voltage of VDD18-VDD_CORE, approximately 1.05V. These levels are below the 1.5V rating for these transistors, thus protecting the NMOS transistors 121 and 122 from over-stress as depicted by the check marks next to transistors 121 and 122. The depicted design therefore safeguards the input transistors against device over-stress faced with the conventional level shifter implementation of FIG. 1. For voltage supply values of VDD18 at 1.8V and VDD_CORE at 0.75V, terminal voltages across the relevant devices are shown in Table 4.

TABLE 4

Devices terminal voltages in level shifter input stage when input is 1.8 V

| MOS | $|V_{ds}|$ | $|V_{gs}|$ | $|V_{gd}|$ | Device Stress |
| --- | --- | --- | --- | --- |
| MP1 | 0 | 0.75 V | 0.75 V | Normal Stress |
| MN1 | 0 | 1.05 V | 1.05 V | Normal Stress |
| MN2 | 1.05 V | 0 | 1.05 V | Normal Stress |

Figure 6:
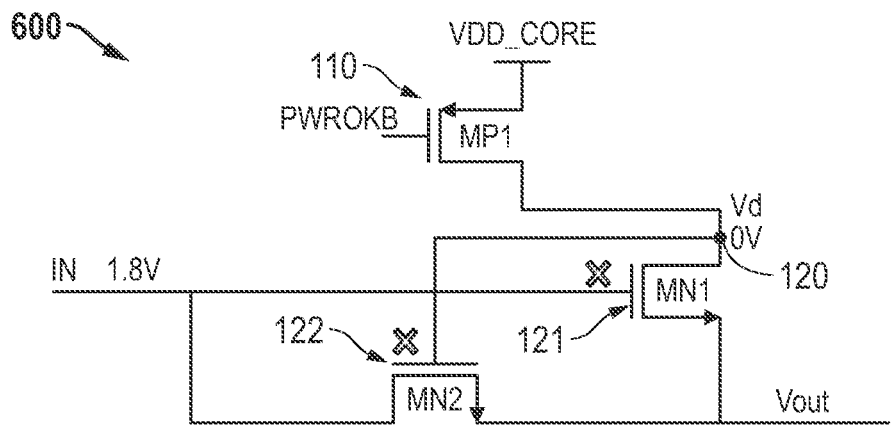
FIG. 6 illustrates in circuit diagram form a transistor overvoltage protection circuit in a state in which the core supply voltage is inactive.

Level shifter circuit 100 also needs to protect the devices therein from overvoltage when VDD_CORE is absent. FIG. 6 illustrates in circuit diagram form a transistor overvoltage protection circuit 600 in a state in which core supply voltage VDD_CORE is inactive. In this condition, enable signal PWROKB is Low (0V) and NMOS transistor 121 has a drain voltage $V_d$ at node 120 that is 0V or some intermediate voltage near 0V. If input signal IN is High (1.8V) when VDD_CORE is absent and the voltage at node 120 is at 0V, then NMOS transistor 121 has gate-to-drain voltage of 1.8V and the device is over-stressed as indicated by the "X" next to gate of NMOS transistor 121. Similarly, the drain-to-gate voltage of NMOS transistor 122 is 1.8V, causing over-stress across the terminals of the NMOS transistor 122 as shown by the "X" next to the gate of NMOS transistor 122. To protect the transistors of level shifter circuit 100 from such overstress, an additional supply loss protection circuit is added in some embodiments.

Figure 7:
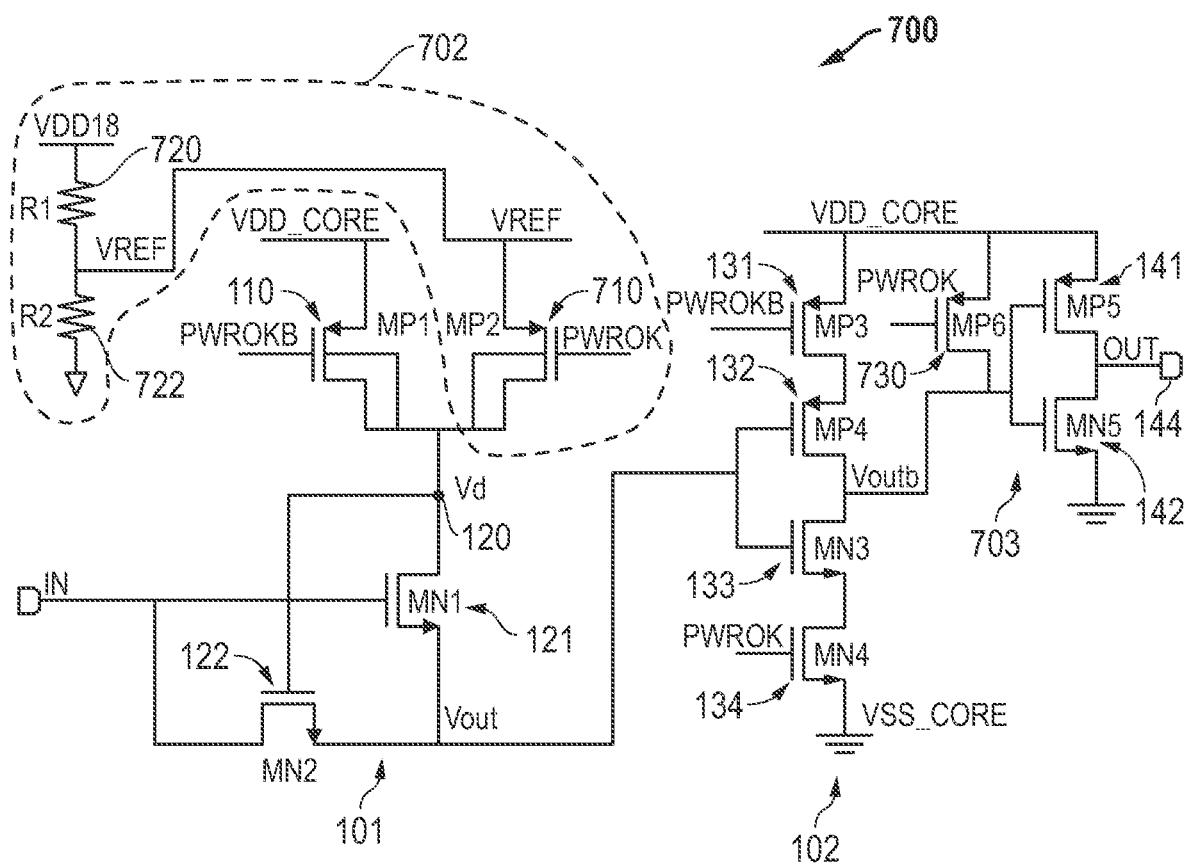
FIG. 7 illustrates in circuit diagram form a level shifter circuit including a supply loss protection circuit according to some embodiments.

FIG. 7 illustrates in circuit diagram form a level shifter circuit 700 including a supply loss protection circuit 702 according to some embodiments. Generally, level shifter circuit 700 includes the elements as described with respect to FIG. 4, and supply loss protection circuit 702. In FIG. 7, certain elements corresponding elements in FIG. 4 have corresponding reference numbers.

Level shifter circuit 100 generally includes a transistor overvoltage protection circuit 101, a tristate buffer 102, and a supply loss protection circuit 702.

Transistor overvoltage protection circuit 101 is supplied with a voltage supply VDD_CORE and has an input terminal labeled "IN" receiving a signal from one of the receivers referenced to the level of I/O voltage supply VDD18. Transistor overvoltage protection circuit includes a PMOS transistor 110, NMOS transistor 121, and an NMOS transistor 122. PMOS transistor 110 has a source coupled to voltage supply VDD_CORE, a gate receiving an enable signal PWROKB, and a drain connected to a central node 120. NMOS transistor 121 has a drain connected to the central node, a gate connected to the input terminal IN, and a source connected to an output terminal "Vout". NMOS transistor 122 has a drain connected to input terminal IN, a gate connected to central node 120, and a source connected to output terminal Vout.

Tristate buffer 102 is a tri-state inverter including PMOS transistor 131, PMOS transistor 132, NMOS transistors 133 and NMOS transistor 134. PMOS transistor 131 has a source connected to supply voltage VDD_CORE, a gate receiving enable signal PWROKB, and a drain. PMOS transistor 132 has a source connected to the drain of PMOS transistor 131, a gate connected to output terminal Vout, and a drain connected to a buffer output terminal labeled "Voutb". NMOS transistor 134 has a source connected to the negative rail VSS_CORE for supply voltage VDD_CORE, a gate receiving enable signal PWROK, and a drain. NMOS transistor 133 has a source connected to the drain of NMOS transistor 134, a gate connected to output terminal Vout, and a drain connected to buffer output terminal Voutb.

The buffer output terminal of tristate buffer 102 is connected to the input terminal of an inverter 703 including a PMOS transistor 141 and an NMOS transistor 142. PMOS transistor 141 has a source receiving supply voltage VDD_CORE, a gate connected to inverter 703's input terminal and a drain connected to an output 144. NMOS transistor 142 has a source connected to the negative supply rail VSS_CORE, a gate connected to inverter 703's input terminal and a drain connected to an output 144. The input terminal of inverter 703 includes an enable transistor 730 with a source terminal connected to the VDD_CORE supply voltage, a drain terminal connected to the input terminal of inverter 703, and a gate terminal receiving the PWROK enable signal. The level-shifted signal referenced to the level of supply voltage VDD_CORE is supplied to circuitry in the core domain of the IC from output 144 and labeled "OUT".

PMOS transistor 110 and NMOS transistors 121 and 122 are 1.5V rated devices, but are employed to scale down incoming VDD18 input voltage signal referenced to 1.8V into VDD_CORE domain signal referenced to 0.75V without experiencing overvoltage conditions in which their $V_{gs}$, $V_{gd}$, or $V_{ds}$ exceed 1.5V.

Supply loss protection circuit 702 includes a reference voltage circuit including a voltage divider formed by a first resistor 720 with a first terminal connected to the I/O voltage supply VDD18, and a second resistor 722 with first terminal connected to a second terminal of resistor 720 and a second terminal connected to the I/O voltage negative supply rail. A reference voltage "VREF" is taken from the second terminal of resistor 720.

The reference voltage VREF is fed to the source of a PMOS transistor 710, which has a drain connected to the drain of NMOS transistor 121 in parallel with that of PMOS transistor 110. The PWROK signal is fed to the gate of PMOS transistor 710. When VDD_CORE is absent, PWROK is low. Due to unavailability of VDD_CORE to supply power sniffer circuit 310 (FIG. 3), PWROKB is also low. PMOS transistor 110 and PMOS transistor 710 turn ON simultaneously, which forms a voltage divider between PMOS transistor 110 and PMOS transistor 710 and ties central node 120 to an intermediate voltage level between VREF and 0V. The presence of this intermediate voltage reduces the risk of NMOS transistor 121 and NMOS transistor 122 failing due to over-stress. Preferably, for embodiments with a VDD18 of 1.8V and a VDD_CORE of 0.75V, VREF is approximately 0.8V. The values of resistor 720 and resistor 722 are chosen based on the desired VREF level, considering both power budget and the available area for constructing on-chip resistors. Table 5 lists the absolute value of drain-to-source voltages "$V_{ds}$", gate-to-source voltages "$V_{gs}$", and gate-to-drain voltages "$V_{gd}$" for transistors 121, 122, 110, and 710 under the condition that the input voltage at terminal IN is 1.8V while VDD_CORE is 0V. (The table uses the schematic part names.) As can be seen, the terminal voltages do not exceed the 1.5V tolerance rating.

TABLE 5

MOS devices terminal voltages with core supply at 0 V and input at 1.8 V

| MOS | $|V_{ds}|$ | $|V_{gs}|$ | $|V_{gd}|$ | Stress |
|---|---|---|---|---|
| MN1 | 0 | 1.2 V | 1.2 V | Normal Stress |
| MN2 | 1.2 V | 0 | 1.2 V | Normal Stress |
| MP1 | 0.6 | 0 | 0.6 | Normal Stress |
| MP2 | 0.2 | 0.8 | 0.6 | Normal Stress |

The circuits of FIG. 3-FIG. 7, or portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which synthesizes the description to produce a netlist including a list of gates from a synthesis library. The netlist includes a set of gates that also represent the functionality of the hardware comprising integrated circuits. The netlist is then placed and routed to produce a data set describing geometric shapes to be applied to masks. The masks are then used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, more than two voltage supply levels may be present in a system. The level shifter circuitry described herein may be applied in many situations in which overvoltage protection is desired for shifting voltage levels between voltage domains. The level shifter circuitry herein may be employed for shifting voltage levels from data transmission circuitry external to an IC, within a multi-chip module, or internal data transmission in some situations.

Accordingly, it is intended by the appended claims to cover all modifications of the disclosed embodiments that fall within the scope of the disclosed embodiments.

What is claimed is:

1. A voltage level-shifting circuit for an integrated circuit (IC) comprising:
an input terminal receiving a voltage signal referenced to an input/output (I/O) voltage level supplied by an I/O voltage supply;
a transistor overvoltage protection circuit supplied with a second voltage supply with a voltage level lower than the I/O voltage level and comprising:
a first p-type metal oxide semiconductor (PMOS) transistor with a source coupled to the second voltage supply, a gate receiving an enable signal, and a drain connected to a central node;
a first n-type metal oxide semiconductor (NMOS) transistor with a drain connected to the central node, a gate connected to the input terminal, and a source connected to an output terminal of the transistor overvoltage protection circuit; and
a second NMOS transistor with a drain connected to the input terminal, a gate connected to the central node, and a source connected to said output terminal of the transistor overvoltage protection circuit; and
an inverter supplied with the second voltage supply and having an input terminal connected to said output terminal of the transistor overvoltage protection circuit.

2. The voltage level-shifting circuit of claim 1, wherein the I/O voltage level is higher than gate-to-source and drain-to-source tolerance voltages of the first PMOS transistor and the first and second NMOS transistors.

3. The voltage level-shifting circuit of claim 2, wherein the I/O voltage level is higher than the highest rated gate-to-source, gate-to-drain, and drain-to-source tolerance voltages available for a technology node with which the IC is constructed.

4. The voltage level-shifting circuit of claim 3, wherein the I/O voltage level is 1.8V and the highest rated gate-to-source, gate-to-drain, and drain-to-source tolerance voltages available for the technology node are equal to or less than 1.5V.

5. The voltage level-shifting circuit of claim 1, further including a supply loss protection circuit comprising:
a reference voltage circuit supplied with the I/O voltage supply and providing a reference voltage at a desired voltage level lower than the I/O voltage supply; and
a second PMOS transistor having a source receiving the reference voltage, a gate supplied with a second enable signal, and a drain connected to the central node.

6. The voltage level-shifting circuit of claim 5, wherein the reference voltage is equal to or lower than gate-to-source, gate-to-drain, and drain-to-source tolerance voltages of the first PMOS transistor and the first and second NMOS transistors.

7. The voltage level-shifting circuit of claim 1, wherein the inverter comprises a tri-state inverter having header and footer transistors with gates receiving the enable signal and its logical inverse, respectively.

8. An integrated circuit (IC) comprising:
a plurality of receivers connected to respective external terminals of the IC and receiving signals referenced to an I/O voltage level supplied by an I/O voltage supply;
a transistor overvoltage protection circuit supplied with a second voltage supply with a voltage level lower than the I/O voltage level and comprising:
an input terminal receiving a signal from one of the receivers referenced to the I/O voltage level;
a first p-type metal oxide semiconductor (PMOS) transistor with a source coupled to the second voltage supply, a gate receiving an enable signal, and a drain connected to a central node;
a first n-type metal oxide semiconductor (NMOS) transistor with a drain connected to the central node, a gate connected to the input terminal, and a source connected to an output terminal of the transistor overvoltage protection circuit; and
a second NMOS transistor with a drain connected to the input terminal, a gate connected to the central node, and a source connected to said output terminal of the transistor overvoltage protection circuit; and
an inverter supplied with the second voltage supply and having an input terminal connected to said output terminal of the transistor overvoltage protection circuit.

9. The IC of claim 8, wherein the I/O voltage level is higher than rated gate-to-source, gate-to-drain, and drain-to-source tolerance voltages of the first PMOS transistor and the first and second NMOS transistors.

10. The IC of claim 9, wherein the I/O voltage level is higher than highest rated gate-to-source, gate-to-drain, and drain-to-source tolerance voltages available for a technology node with which the IC is constructed.

11. The IC of claim 10, wherein the I/O voltage level is 1.8V and the highest rated gate-to-source, gate-to-drain, and drain-to-source tolerance voltages available for the technology node are equal to or less than 1.5V.

12. The IC of claim 8, wherein the transistor overvoltage protection circuit further including a supply loss protection circuit comprising:
a reference voltage circuit supplied with the I/O voltage supply and providing a reference voltage at a desired voltage level lower than the I/O voltage supply; and
a second PMOS transistor having a source receiving the reference voltage, a gate supplied with a second enable signal, and a drain connected to the central node.

13. The IC of claim 12, wherein the reference voltage is equal to or lower than rated gate-to-source, gate-to-drain, and drain-to-source tolerance voltages of the first PMOS transistor and the first and second NMOS transistors.

14. The IC of claim 8, wherein the inverter comprises a tri-state inverter having header and footer transistors with gates receiving the enable signal and its logical inverse, respectively.

15. The IC of claim 8, further comprising a supply detection circuit operable to produce the enable signal responsive to detecting when the second voltage supply is active.

16. A method of operating an integrated circuit (IC) comprising:
receiving a data signal at a receiver circuit operating with a first voltage supply;
driving a gate of a first p-type metal oxide semiconductor (PMOS) transistor with an enable signal to enable an overvoltage protection feature, the first PMOS transistor including a source coupled to a second voltage supply with a voltage level lower than that of the first voltage supply, and a drain connected to a central node;
driving a gate of a first n-type metal oxide semiconductor (NMOS) transistor with an output of the receiver circuit referenced to the first voltage supply, the first NMOS transistor including a drain connected to the central node and a source connected to an output terminal; and
applying the output of the receiver circuit to a drain of a second NMOS transistor, the second NMOS transistor including a gate connected to the central node, and a source connected to said output terminal for providing the data signal at said output terminal.

17. The method of claim 16 further comprising:
providing a reference voltage at a desired voltage level relative to the first voltage supply; and
responsive to the second voltage supply being unavailable, coupling the reference voltage to the central node using a second PMOS transistor.

18. The method of claim 17, wherein the reference voltage is equal to or lower than rated gate-to-source, gate-to-drain, and drain-to-source tolerance voltages of the first PMOS transistor and the first and second NMOS transistors.

19. The method of claim 16, wherein the first voltage supply is higher than rated gate-to-source, gate-to-drain, and drain-to-source of the first PMOS transistor and the first and second NMOS transistors.

20. The method of claim 16, wherein the first voltage supply is higher than highest rated gate-to-source, gate-to-drain, and drain-to-source tolerance voltages available for a technology node with which the IC is constructed.

\* \* \* \* \*